United States Patent
Golan

(10) Patent No.: US 9,310,450 B2
(45) Date of Patent: Apr. 12, 2016

(54) MARGIN ASSESSMENT OF EX-VIVO SAMPLE

(75) Inventor: Erez Golan, Rehovot (IL)

(73) Assignee: CLEAR-CUT MEDICAL LTD., Rehovot (IL)

(*) Notice: Subject to any disclaimer, the term of this patent is extended or adjusted under 35 U.S.C. 154(b) by 772 days.

(21) Appl. No.: 13/522,353

(22) PCT Filed: Jan. 31, 2011

(86) PCT No.: PCT/US2011/023101
§ 371 (c)(1),
(2), (4) Date: Jul. 16, 2012

(87) PCT Pub. No.: WO2011/094659
PCT Pub. Date: Aug. 4, 2011

(65) Prior Publication Data
US 2012/0299591 A1 Nov. 29, 2012

Related U.S. Application Data

(60) Provisional application No. 61/300,156, filed on Feb. 1, 2010.

(51) Int. Cl.
| | |
|---|---|
| *G01R 33/483* | (2006.01) |
| *G01R 33/30* | (2006.01) |
| *G01R 33/563* | (2006.01) |
| *G01R 33/341* | (2006.01) |
| *G01R 33/3415* | (2006.01) |

(52) U.S. Cl.
CPC .............. *G01R 33/483* (2013.01); *G01R 33/30* (2013.01); *G01R 33/56375* (2013.01); *G01R 33/341* (2013.01); *G01R 33/3415* (2013.01)

(58) Field of Classification Search
CPC ..... G01R 33/30; G01R 33/341; G01R 33/483; G01R 33/3415; G01R 33/56375
See application file for complete search history.

(56) References Cited

U.S. PATENT DOCUMENTS

| | | | |
|---|---|---|---|
| 5,162,103 A | 11/1992 | Dechene | |
| 6,032,068 A * | 2/2000 | Daniel et al. | ............ 600/412 |
| 6,289,682 B1 | 9/2001 | Rada | |
| 7,227,630 B1 | 6/2007 | Zavislan | |

(Continued)

FOREIGN PATENT DOCUMENTS

| | | |
|---|---|---|
| WO | 00/49392 | 8/2000 |
| WO | 2007/142678 | 12/2007 |

OTHER PUBLICATIONS

PCT Written Opinion PCT/US2011/023101.

*Primary Examiner* — Dixomara Vargas
(74) *Attorney, Agent, or Firm* — Dekel Patent Ltd.; David Klein

(57) ABSTRACT

A system (10) for margin assessment of an ex-vivo tissue (18), including an imaging scanner (12) controlled by an imaging control unit (14), and an ex-vivo sample holder (16) for holding a sample of an excised tissue (18), the sample holder (16) being sized such that excised lump edges (24) of the excised tissue (18) are forced against a surface of the sample holder (16) such that the edges (24) change shape to have a predetermined geometry, and wherein the imaging scanner (12) is positioned relative to the sample holder (16) such that the imaging scanner (12) acquires images not of all the tissue (18) but rather of the edges (24) that have the predetermined geometry and which are in a sensitive region (40) extending into a peripheral margin of the tissue (18).

12 Claims, 20 Drawing Sheets

(56) References Cited

U.S. PATENT DOCUMENTS

| | | |
|---|---|---|
| 8,038,595 B2 * | 10/2011 | Laham et al. .................. 600/37 |
| 8,068,896 B2 * | 11/2011 | Daghighian et al. .......... 600/436 |
| 8,208,709 B2 * | 6/2012 | Ding et al. .................... 382/131 |
| 8,345,927 B2 * | 1/2013 | Ishikawa et al. ............... 382/106 |
| 8,463,361 B2 * | 6/2013 | Tupin, Jr. ...................... 600/427 |
| 8,688,193 B2 * | 4/2014 | Doyle et al. ................... 600/410 |
| 8,983,580 B2 * | 3/2015 | Boppart et al. ................ 600/473 |

\* cited by examiner

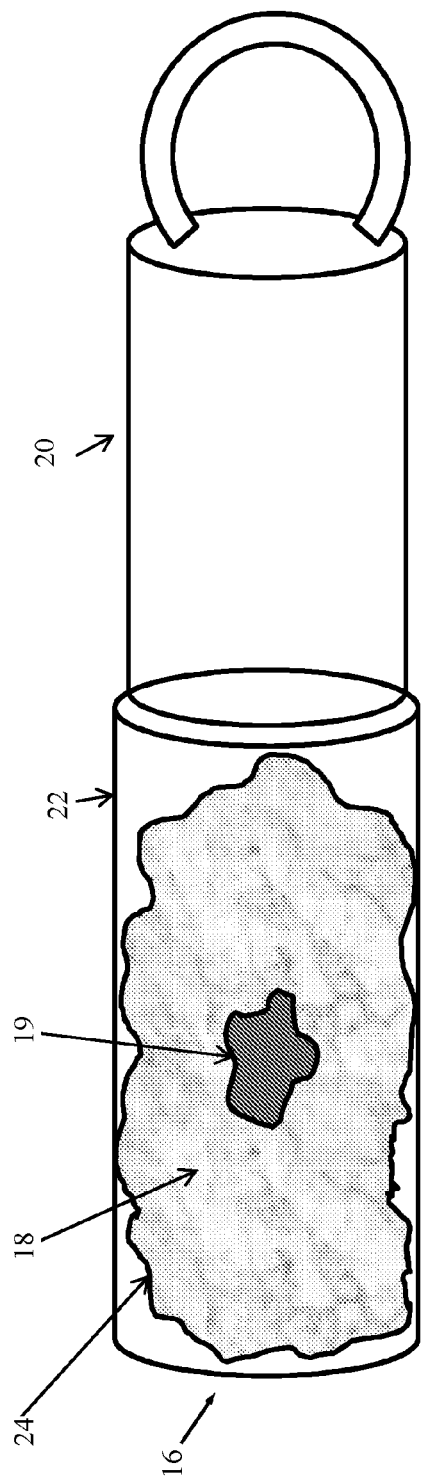
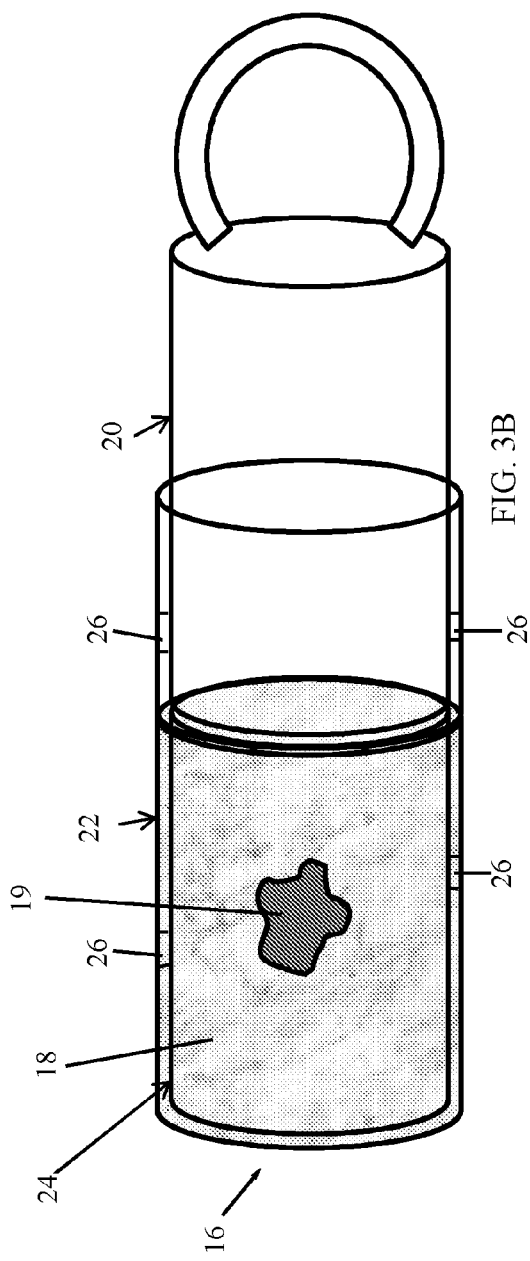

MARGIN ASSESSMENT OF EX-VIVO SAMPLE

CROSS REFERENCE TO RELATED APPLICATIONS

This application is a national phase application of PCT patent application PCT/US2011/023101, filed 31 Jan. 2011, which claims priority under 35 USC §119 to U.S. Provisional Patent Application Ser. No. 61/300,156, filed 1 Feb. 2010, which are incorporated herein by reference.

FIELD OF THE INVENTION

The present invention relates generally to surgical devices and methods for confirming an existence of a clean margin of healthy tissue around an excised tumor, and for determining the thickness of the margin.

BACKGROUND OF THE INVENTION

When a malignant tumor is found in a breast, generally treatment involves either mastectomy or lumpectomy, sometimes followed by radiation therapy. The location of the tumor is found by different imaging modalities, such as x-ray, ultrasound, CT, MRI and others. After locating the tumor, a portion of the tissue, including the cancerous portion and a layer of healthy tissue surrounding the cancerous portion, is excised. It is important that the layer of healthy tissue envelop (enclose) the cancerous portion, to ensure that all the malignancy has been removed. This layer is often referred to as a "clean margin", and its depth or thickness may range from 1 cell layer, or about 40 microns, to 10 mm (or other values, depending on the tumor, location and other factors); often a few millimeters is considered a clean margin.

A pathologist samples the margins of the excised portion at different points, especially suspicious points, to assess whether or not the tissue margins around the outer surface of the excised lump are free of cancerous tissue. Currently, there are no real-time means to assess margin status (frozen sections done for determining axillary lymph node involvement cannot be done on breast tissue due to high fat content), and standard pathologic evaluation of the excised lump can last a few days to weeks. If pathology results are positive, the patient needs to undergo another operation, until the cancerous tissue has been completely removed.

SUMMARY OF THE INVENTION

The present invention seeks to provide improved surgical devices and methods for confirming the existence of a clean margin of healthy tissue around an excised tumor, and for determining the thickness of the margin, as described in more detail further below.

The disclosed invention may be useful in giving real-time feedback to surgeons performing lumpectomy (excision of breast cancer tumors), on whether or not they have completely removed the cancerous tissue, i.e. whether or not the tissue margins around the outer surface of the excised lump are free of cancerous tissue. The invention is not intended to replace definitive pathologic evaluation, but rather to give the surgeon a real time indication if additional tissue needs to be excised, in order to significantly reduce the re-operation rates.

It has been found that only the surface of the lump needs to be evaluated, and the present invention uses this fact to its advantage to provide a very simple and low cost means for MRI evaluation within the operating room.

There is thus provided in accordance with an embodiment of the present invention a system for margin assessment of an ex-vivo tissue, including an imaging scanner controlled by an imaging control unit, and an ex-vivo sample holder for holding a sample of an excised tissue, the sample holder being sized such that excised lump edges of the excised tissue are forced against a surface of the sample holder such that the edges change shape to have a predetermined geometry, and wherein the imaging scanner is positioned relative to the sample holder such that the imaging scanner acquires images (or measurements) not of all the tissue but rather of the edges that have the predetermined geometry and which are in a sensitive region extending into a peripheral margin of the tissue.

BRIEF DESCRIPTION OF THE DRAWINGS

The present invention will be understood and appreciated more fully from the following detailed description, taken in conjunction with the drawings in which:

FIGS. 3A and 3B are simplified illustrations of an ex-vivo sample holder, constructed and operative in accordance with an embodiment of the present invention, wherein FIG. 3A illustrates a tightening element in an open position, and FIG. 3B illustrates the tightening element pushed into a container to force the excised lump edges to be bound by the walls of the container.

FIGS. 17A and 17B are simplified illustrations of the ex-vivo sample holder of FIG. 16 with an excised lump in it, wherein FIG. 17A is a general view of the sample holder and FIG. 17B is a transverse cross-section of the same sample holder.

DETAILED DESCRIPTION OF EMBODIMENTS

Figure 1:
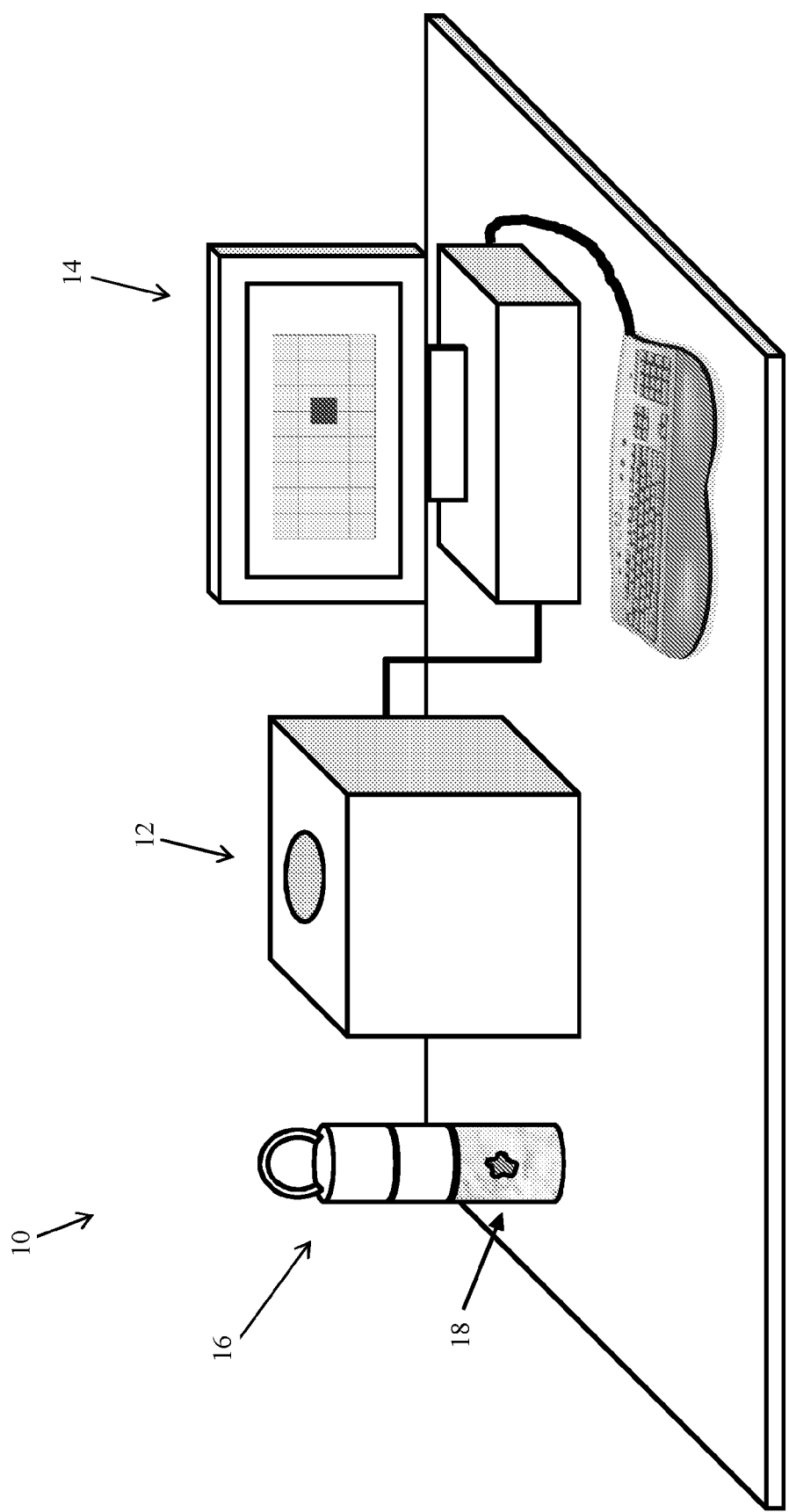
FIG. 1 is a simplified illustration of a system for intra-operative margin assessment, constructed and operative in accordance with an embodiment of the present invention.

Reference is now made to FIG. 1, which illustrates a system 10 for intra-operative margin assessment, constructed and operative in accordance with a non-limiting embodiment of the present invention. System 10 is described herein for MRI, but the invention may be carried out with other imaging modalities, such as but not limited to, x-ray, ultrasound, CT, optical, confocal microscopy, optical coherence tomography, infrared, thermal imaging, ESR (electron spin resonance) and others.

System 10 includes a relatively small size imaging scanner 12 (e.g., an MRI scanner), controlled by an imaging control unit 14, readily available and well known for the particular imaging modality. An ex-vivo sample holder 16 holds a tissue sample, referred to as the excised tissue 18 or ex-vivo tissue 18, after it has been removed from the patient, in a predetermined geometry. The ex-vivo sample holder 16 is inserted into the imaging scanner 12, which performs automatic scanning of the surface (margins) of the excised tissue 18.

Figure 2:
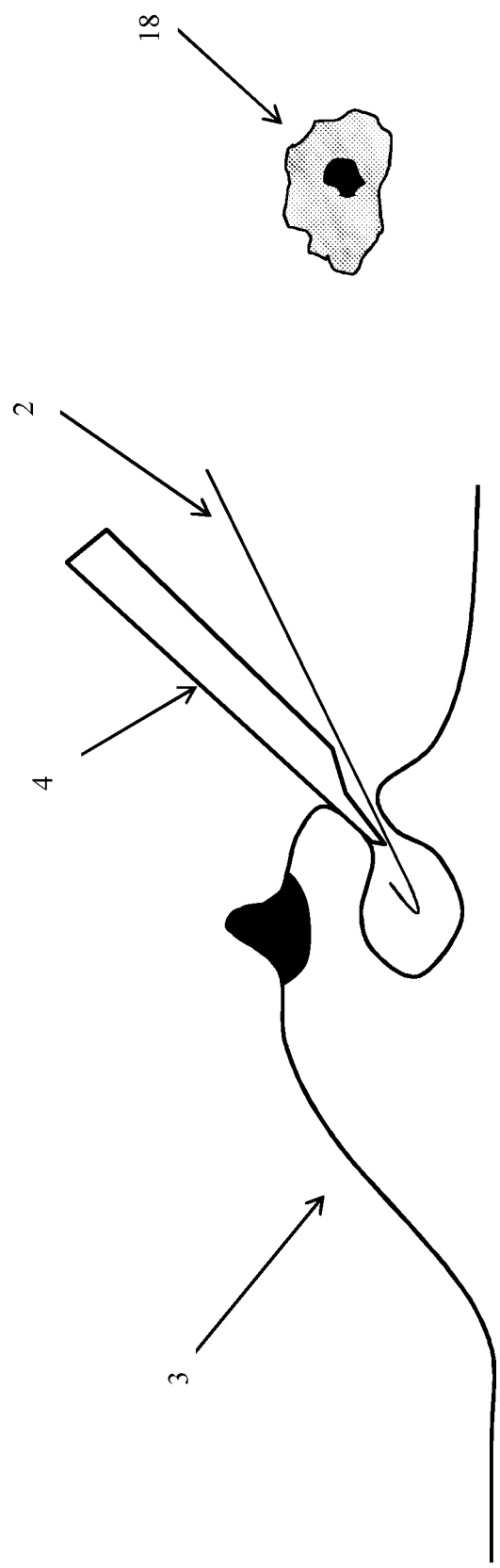
FIG. 2 is a simplified illustration of a lumpectomy procedure of the prior art.

Reference is now made to FIG. 2, which illustrates a typical lumpectomy procedure of the prior art. The surgeon usually receives the patient with a tumor marker wire 2, which has been inserted into a breast 3 before the operation under ultrasonic or X-ray guidance to mark the center of the tumor. The surgeon then uses an excision tool 4 to excise tissue around the marked center of the tumor, to receive an excised lump 18. The surgeon makes an effort to excise enough tissue around the tumor so that at a clean margin encloses the tumor, while not excising unnecessarily too much normal tissue in order to conserve as much as possible the normal appearance of the breast. The clean margin preferably has a thickness of at least a few millimeters (i.e., the thickness around the tumor which is free of cancerous tissue). However, the invention is not limited to this value, and other thicknesses, such as 40 microns to 1 mm or from 1 mm to 10 mm may be considered a clean margin (or other values, depending on the tumor, location and other factors).

Reference is now made to FIGS. 3A-3B, which illustrate one possible, non-limiting embodiment of ex-vivo sample holder 16. The ex-vivo sample holder 16 includes a tightening element 20, shown in FIG. 3A in an open position, allowing the excised lump 18 containing a tumor 19 to be inserted into a container 22, which may be cylindrical in shape. The excised lump 18 has lump edges 24, which may be very irregular at this stage. The tightening element 20 may be shaped like a cylindrical piston or syringe plunger.

FIG. 3B illustrates tightening element 20 pushed into container 22, which forces the excised lump edges 24 to be bound by the walls of container 22, so that the lump edges 24 generally conform to the inner peripheral shape of container 22 (in the illustrated embodiment, this shape is cylindrical). In order to allow tight fitting of the lump edges 24 to the inner surface of container 22, the container 22 may be formed with airways 26 to allow air trapped in the container 22 to be released. The container walls may be made of a solid material, a net or mesh, etc. The container 22, including the tightening element 20, may be completely disposable (for single use).

Figure 4:
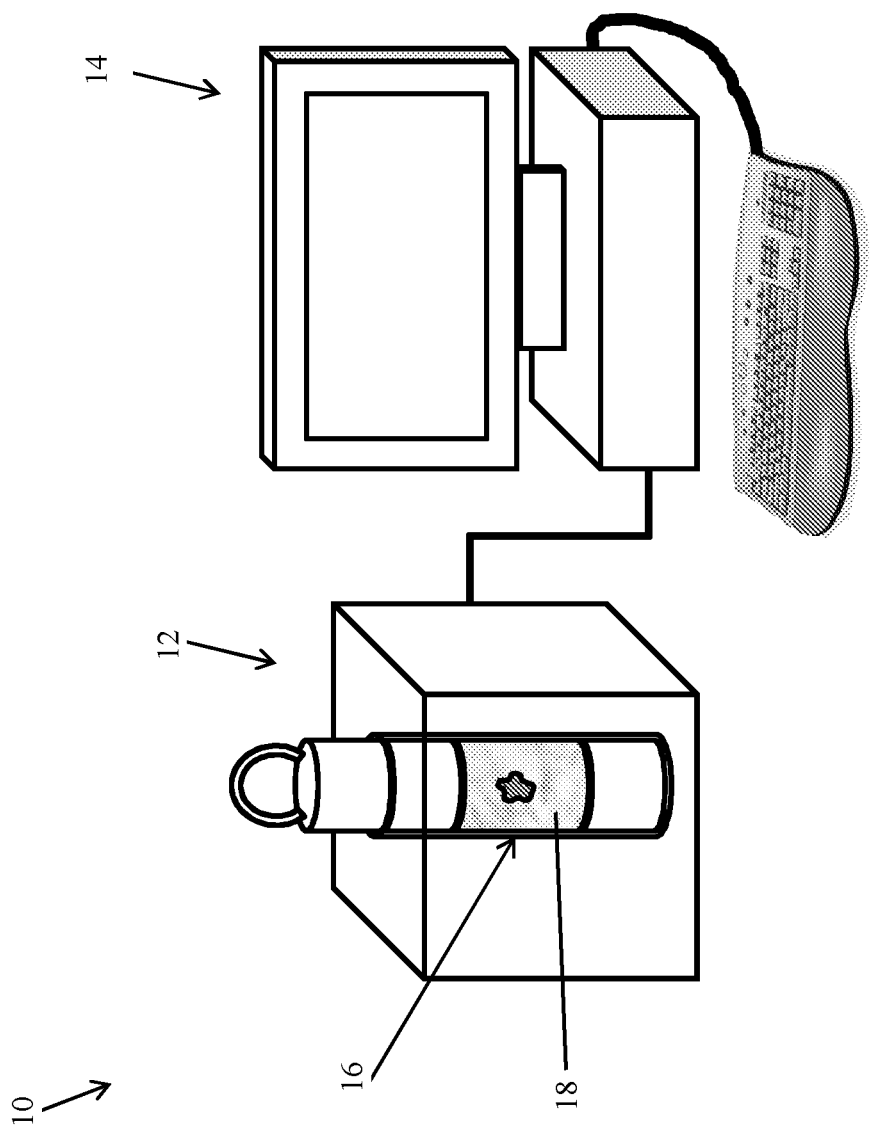
FIG. 4 is a simplified illustration of the sample holder of FIG. 3 holding an ex-vivo sample.

Reference is now made to FIG. 4, which illustrates the sample holder 16 holding the ex-vivo sample (excised lump) 18, inserted into scanner 12, which is connected to control unit 14.

Figure 5:
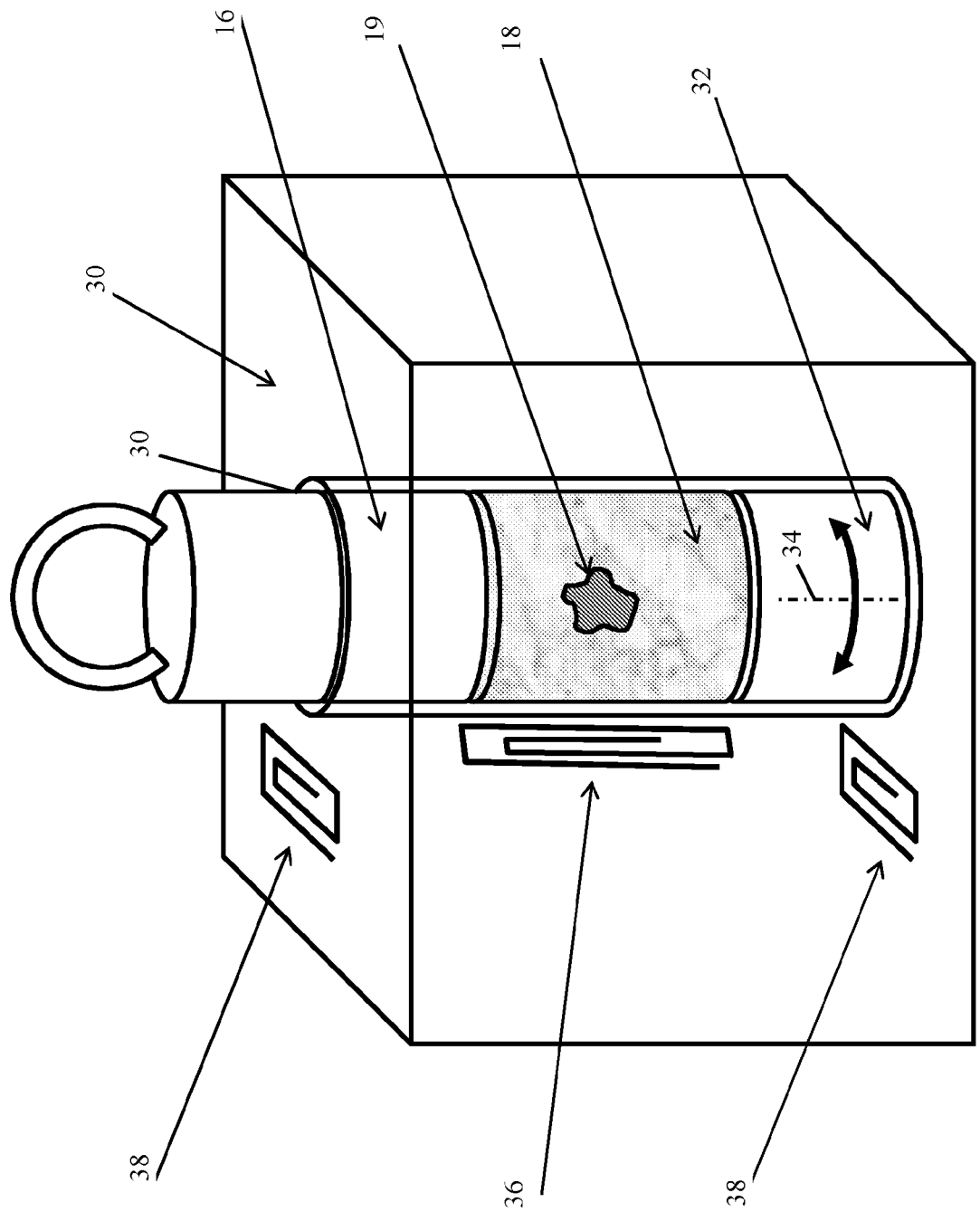
FIG. 5 is a simplified illustration of an MRI scanner, constructed and operative in accordance with another embodiment of the present invention which can work together with the sample holder described in FIGS. 3 and 4.

Reference is now made to FIG. 5, which illustrates a more detailed description of one possible embodiment of scanner 12, that of an MRI scanner. A box-shaped (prismatic) magnet 28 (can be a permanent magnet, an electro-magnet, a superconducting magnet, etc.) is formed with an internal cavity 30, into which sample holder 16 is inserted. The magnet 28 can be composed of one piece having a uniform magnetization direction, or of several pieces, each with a different magnetization direction, in order to optimize the static magnetic field ($B_0$) intensity and distribution (profile) within the region of the sample that needs to be measured/imaged. The sample holder 16 is inserted into the cavity 30 and is mounted on a rotating stage 32, which rotates the excised lump 18 about a rotation axis 34, such as the symmetry axis of the cylindrical holder 16. A transmit/receive coil 36 is mounted adjacent to cavity 30, and is in close proximity to the outer periphery of sample holder 16 with excised lump 18 therein. Gradient coils 38 are positioned above and below the height of the excised lump 18. It is noted that the terms "upper", "lower", "above", "below", "left" and "right", and the like, only refer to the sense of the drawings and do not limit the invention in any way.

Figure 6:
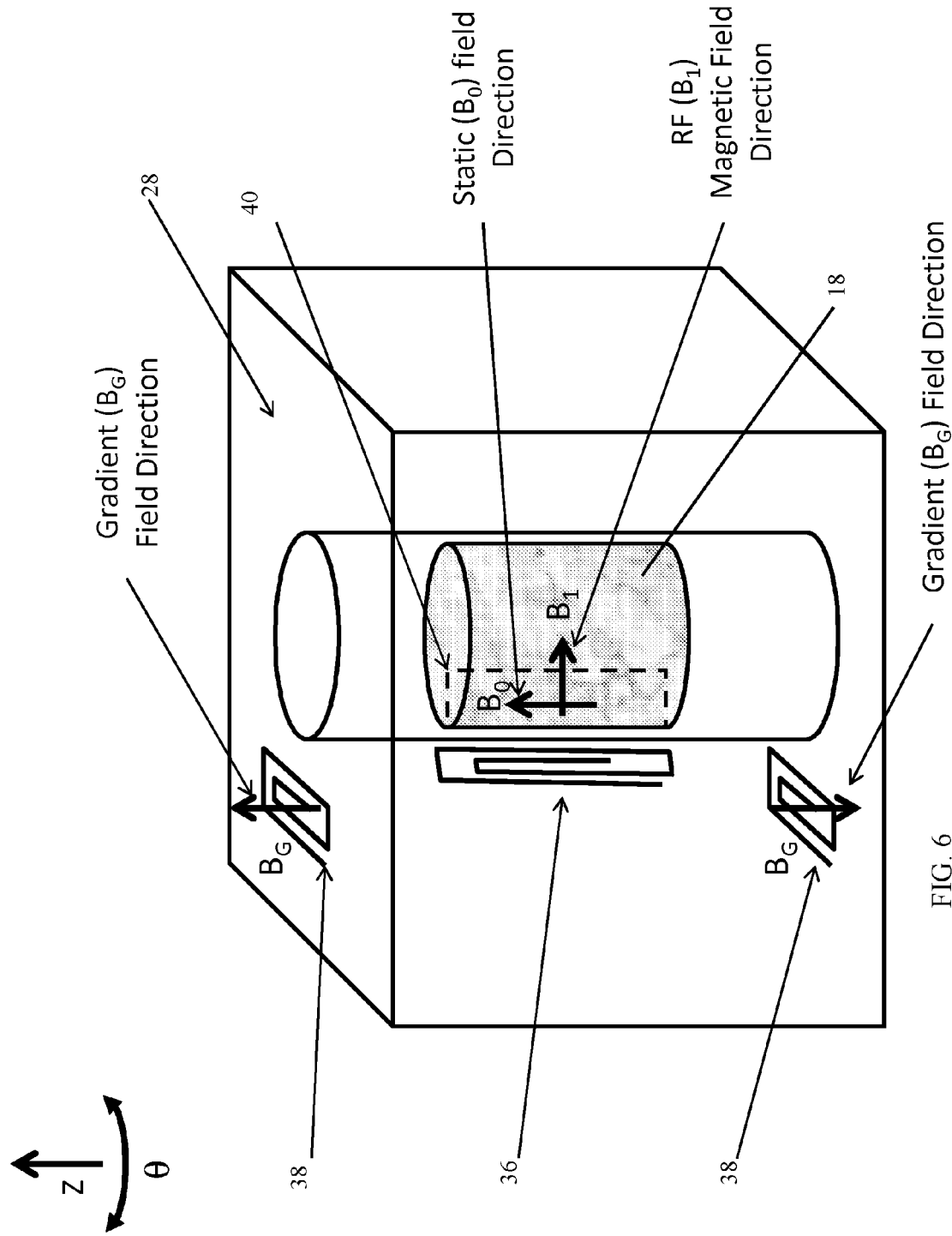
FIG. 6 is a simplified illustration of the magnetic field patterns and sensitive region generated by the MRI scanner of FIG. 5.

Reference is now made to FIG. 6, which illustrates a side-view of the magnetic field patterns and sensitive region 40 generated by the MRI scanner 12 of FIG. 5. The static (permanent or electro-) magnet produces a static magnetic field ($B_0$), which within the volume of the ex-vivo sample, is generally directed along the z-axis. The transmit/receive coil 36, once activated, produces a time-varying RF ($B_1$) magnetic field perpendicular to the $B_0$ field, pointing towards the center of the ex-vivo sample 18. The transmit/receive coil 36 can be designed to be large enough relative to the ex-vivo sample height, so that the intensity of the $B_1$ field is relatively constant throughout the height of the sample. At the same time the transmit/receive coil 36 can be thin enough so to effectively excite only nuclear spins that are located only within a relatively narrow and superficial sensitive region within the ex-vivo sample, e.g. from the surface of the ex-vivo sample and up to a few millimeters into the sample. The depth of the sensitive region 40 into the ex-vivo sample 18 is determined by the coil sensitivity profile, and by the homogeneity of the $B_0$ field, which can be relatively good if the sensitive region 40 is up to a few millimeters into the sample. In order to obtain z-resolution, i.e. to separate measurements originating at various z-positions within the sensitive region, the upper and lower gradient coils 38 can be used, so that when they are activated, they produce gradient ($B_G$) fields that are aligned along the +z and −z directions respectively. The gradient coils 38 can create a $B_G$ field pattern that is linear in the z direction.

Figure 7:
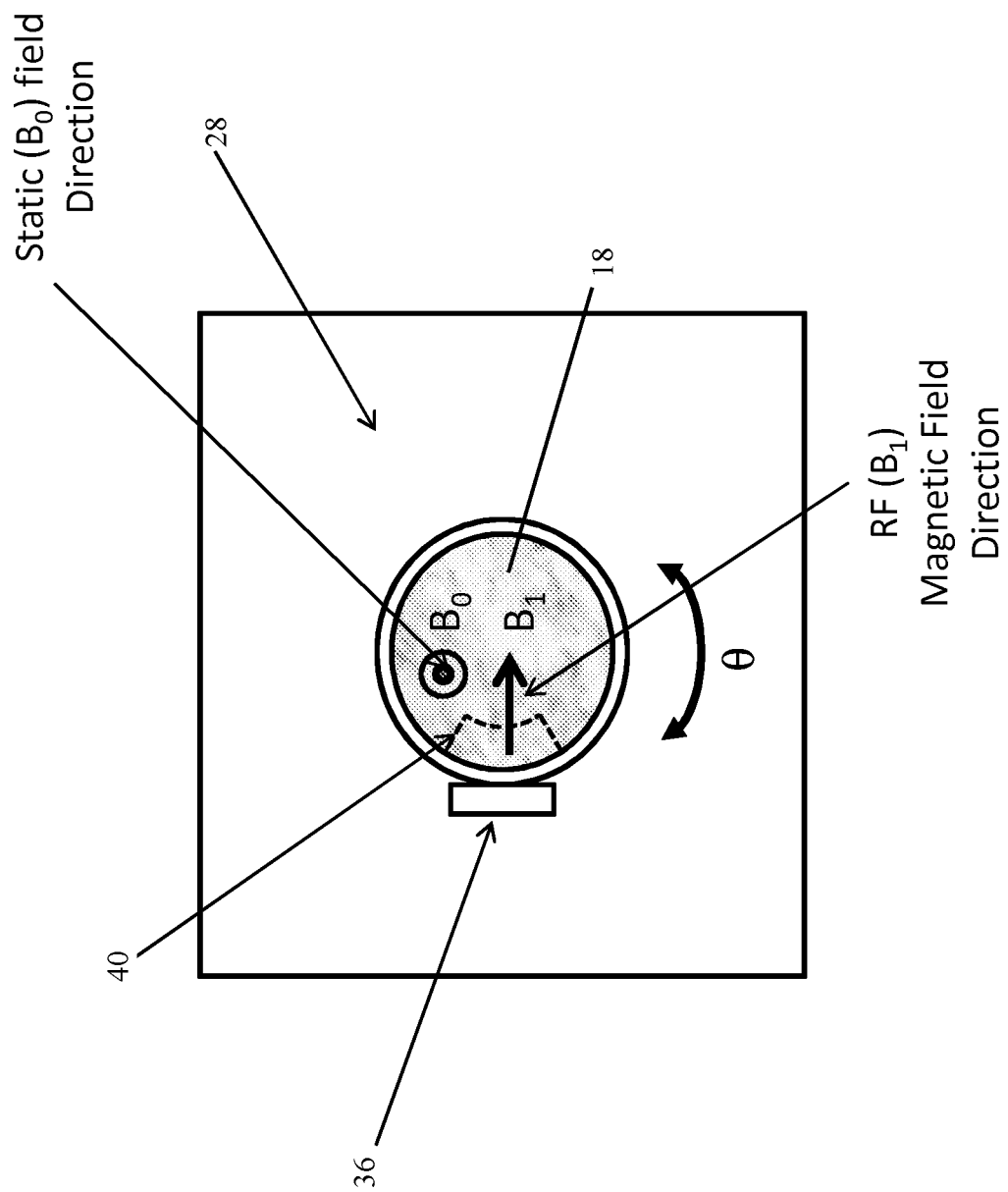
FIG. 7 is a further simplified illustration of the magnetic field patterns and sensitive region generated by the MRI scanner of FIG. 5.

Reference is now made to FIG. 7, which illustrates a top-view of the magnetic field patterns and sensitive region 40 generated by the MRI scanner 12 of FIG. 5. The static $B_0$ field generated by the magnet 28 is aligned along the z direction. The $B_1$ field generated by the transmit/receive coil 36 is directed perpendicularly to the $B_0$ field, and to the center of the ex-vivo sample 18. The sensitive region 40, the shape and dimensions of which are determined mainly by the geometry of the transmit/receive coil 36, extends a few millimeters into the ex-vivo sample 18, and a certain angular aperture out of the entire sample circumference. This way, an angular (θ) resolution is achieved, i.e. signals are received only from a specific angular aperture in the sample.

Figure 8:
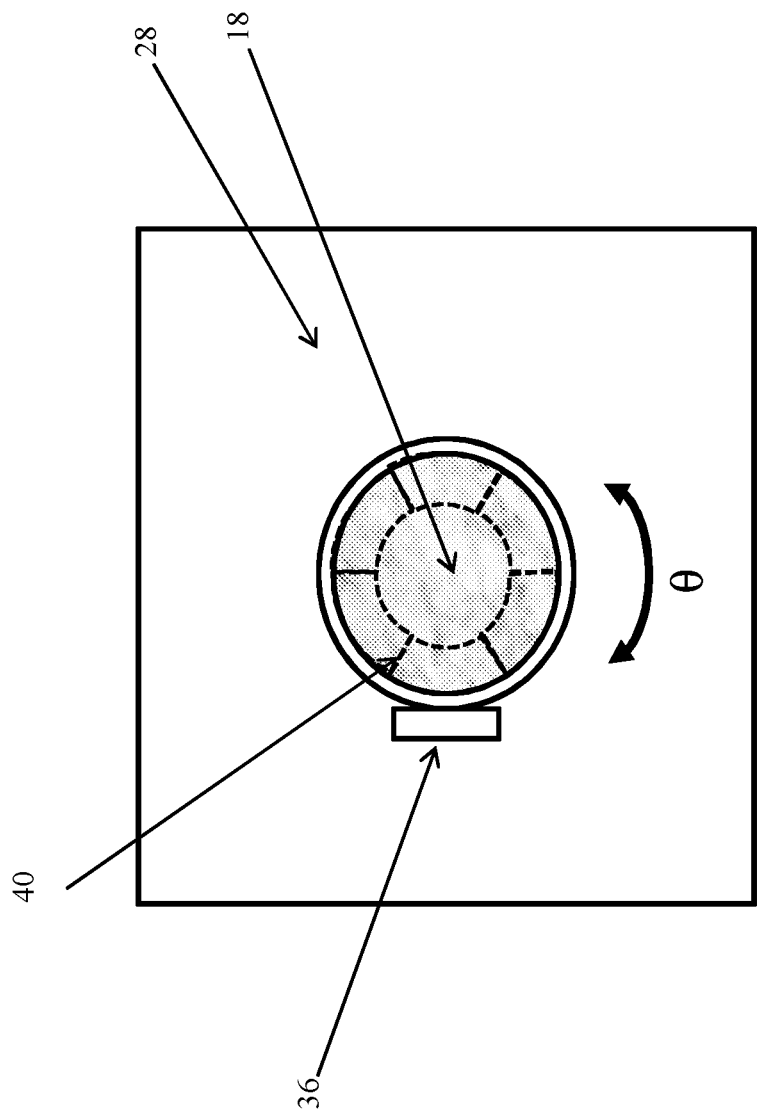
FIG. 8 is a simplified illustration of how the margins on the entire circumference of the ex-vivo sample are measured/imaged by the MRI scanner of FIG. 5, in accordance with an embodiment of the present invention.

Reference is now made to FIG. 8, which illustrates how the margins on the entire circumference of the ex-vivo sample 18 are measured/imaged by the MRI scanner 12 of FIG. 5. The excised lump 18 is rotated by the rotating stage 32 (not shown here, but shown in FIG. 5), such as by using a step motor. At each angular step, the transmit/receive coil 36 excites and obtains a signal from the sensitive region 40, and uses the z-gradient coils 38 (not shown here, but shown in FIG. 5) to create the z-dimension. When signal acquisition at one angular position is completed, the sample is rotated and a signal from the next angular position is acquired.

Figure 9:
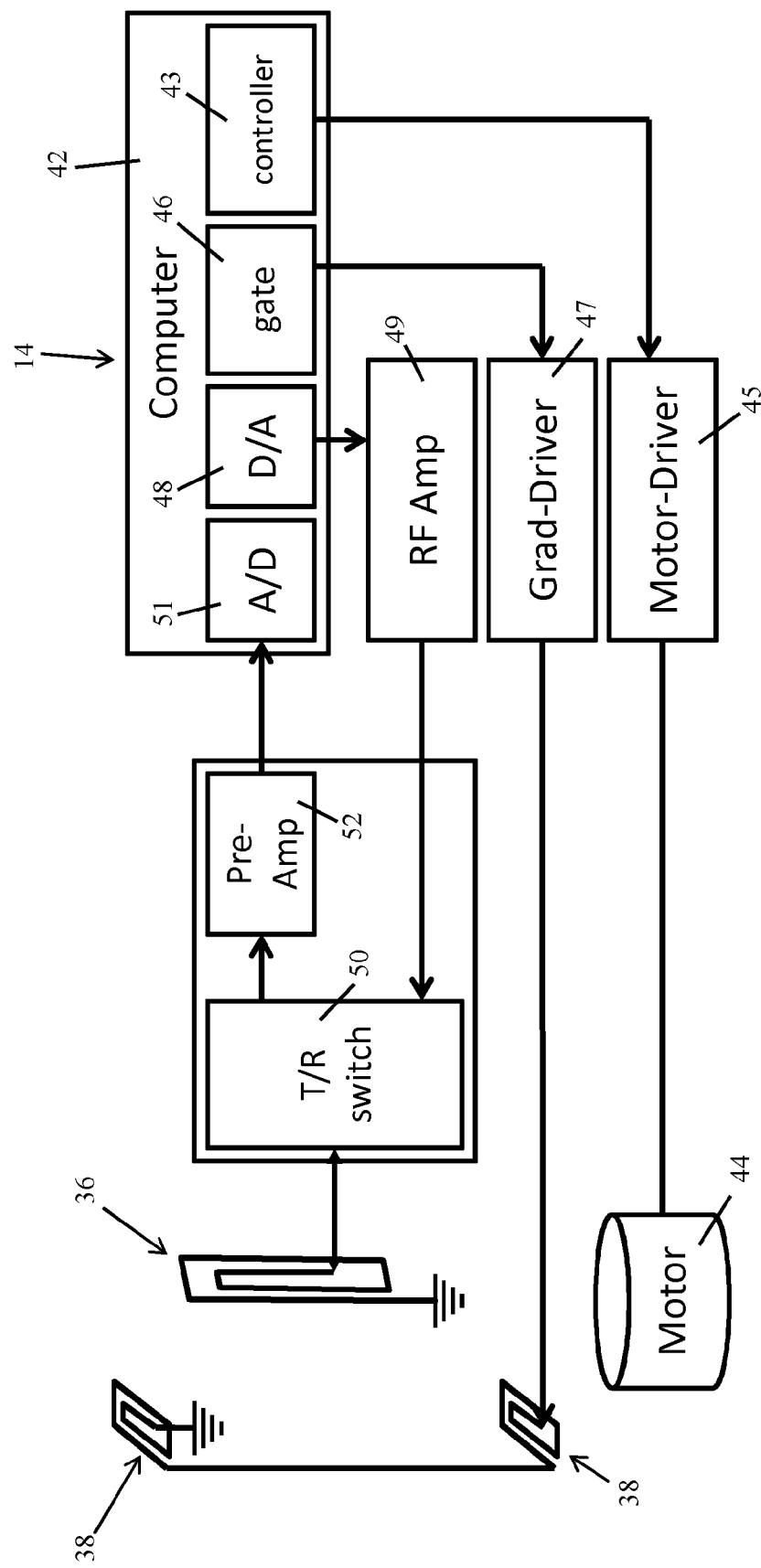
FIG. 9 is a simplified illustration of the system schematics of the MRI scanner of FIG. 5.

Reference is now made to FIG. 9, which illustrates the system schematics of the MRI scanner 12 of FIG. 5, in accordance with a non-limiting embodiment of the present invention. The control unit 14 includes a personal computer (PC) 42, which includes a controller 43 that activates and controls operation of a motor 44 that rotates the rotating stage (not shown in FIG. 9) via a motor driver 45. PC 42 includes a gate 46 that triggers a gradient driver 47, which drives current through the upper and lower gradient coils 38. Digital to analog (D/A) circuitry 48 creates RF pulses which are amplified by an RF amplifier 49 (RF Amp) and transmitted through an RF transmit/receive switch 50 into the transmit/receive coil 36. Analog to digital (A/D) circuitry 51 records the MRI signals received by the transmit/receive switch 50 as amplified by a pre-amplifier (Pre-Amp) 52.

Figure 10:
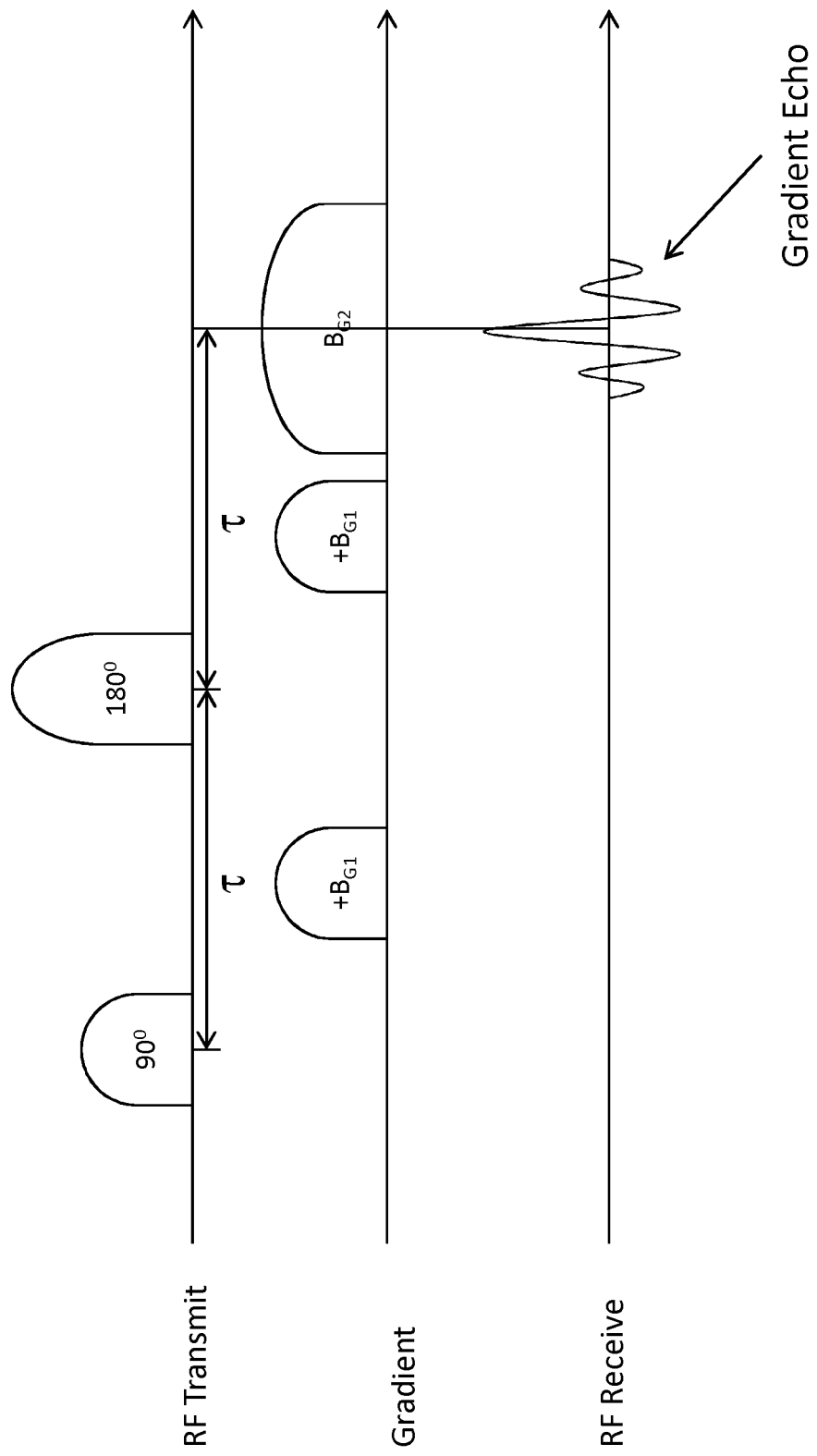
FIG. 10 is a simplified illustration of one possible pulse sequence that can be used in conjunction with the MRI scanner described in FIG. 5 for obtaining a diffusion-weighted z-profile of the margins of an ex-vivo sample.

Reference is now made to FIG. 10, which illustrates one possible pulse sequence that can be used in conjunction with the MRI scanner 12 of FIG. 5 for obtaining a diffusion-weighted z-profile of the margins of an ex-vivo sample. Similar pulse sequences are well known in the art. Diffusion weighted MRI is specifically known in the art as a very sensitive and specific method to detect cancerous tissue. In the sequence of FIG. 10, a first (90°) RF pulse followed by a second (180°) RF pulse are given, with a time gap of τ. In between the two RF pulses, the z-gradient is activated ($B_{G1}$) for a short duration. After the second RF pulse, the same z-gradient is activated for a similar duration and amplitude. If the $B_0$ field is relatively homogenous within the sensitive region and if the spins do not diffuse, then at time 2×τ the spins should be completely refocused to create a gradient echo. The more self-diffusion the spins undergo, the more attenuated the gradient echo will be. In addition, if the z-gradient coil is active during signal acquisition (RF receive), then the gradient echo will contain z-position information. By applying a Fourier-transform to the acquired gradient echo, as is known in the art, a diffusion-weighted z-position vector is generated.

Figure 11:
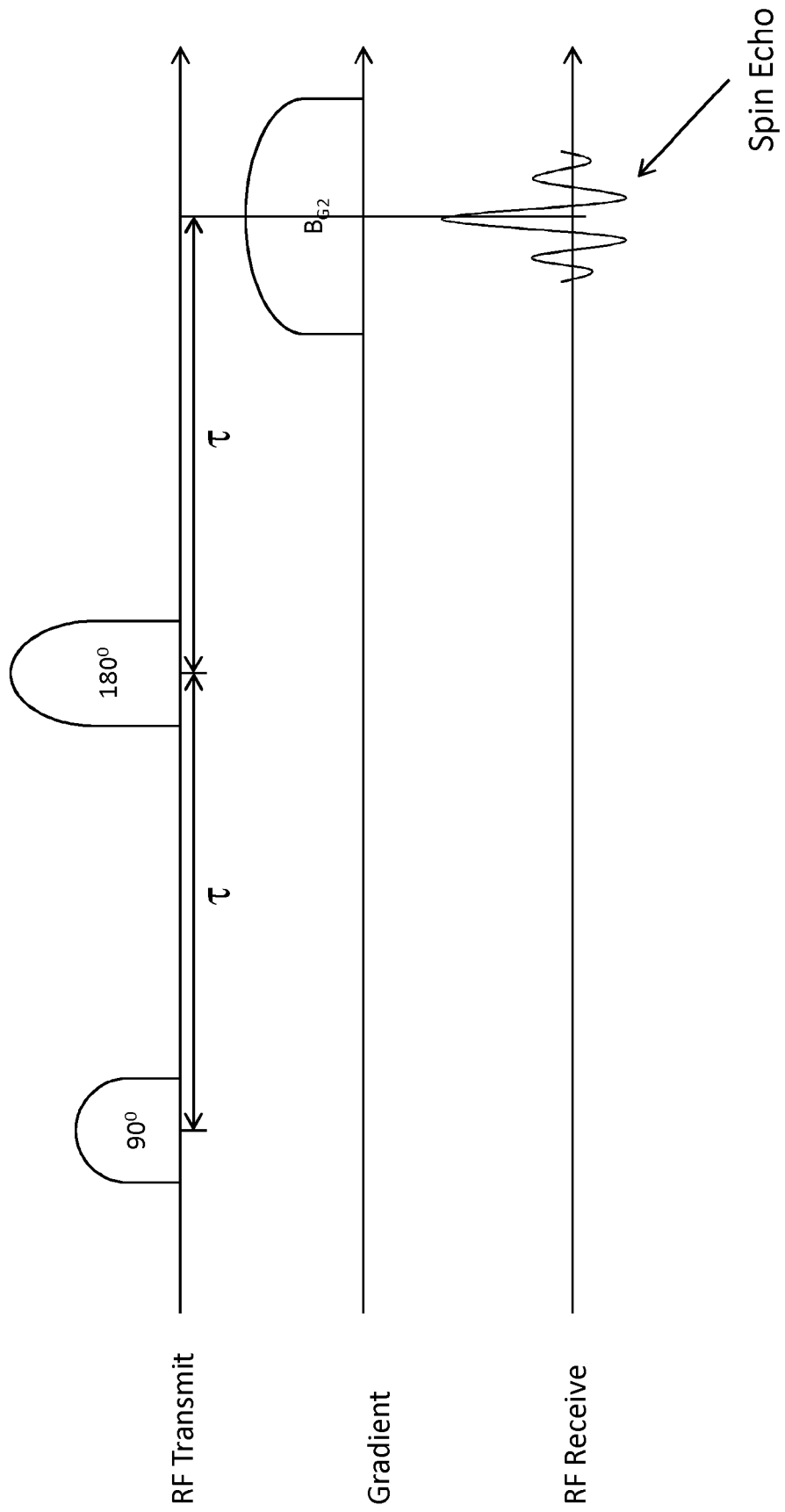
FIG. 11 is a simplified illustration of yet another possible pulse sequence that can be used in conjunction with the MRI scanner described in FIG. 5 for obtaining a T2-weighted z-profile of the margins of an ex-vivo sample.

Reference is now made to FIG. 11, which illustrates yet another possible pulse sequence that can be used in conjunction with the MRI scanner 12 of FIG. 5 for obtaining a T2-weighted z-profile of the margins of an ex-vivo sample. Similar pulse sequences are well known in the art. T2-weighted MRI is also known in the art to be useful for detecting cancerous tissue. In the sequence of FIG. 11, a first (90°) RF pulse followed by a second (180°) RF pulse are given, with a time gap of τ, which should be long enough relative to the typical T2 of breast tissue. If the $B_0$ field is relatively homogenous within the sensitive region, then at time 2×τ the spins should be completely refocused to create a spin echo. The shorter the T2 is in the sensitive region, the more attenuated the gradient echo will be. In addition, if the z-gradient coil is active during signal acquisition (RF receive), then the spin echo will contain z-position information. By applying a Fourier-transform to the acquired gradient echo, as is known in the art, a T2-weighted z-position vector is generated. Similarly, T1-weighted, parametric ADC (apparent diffusion coefficient) measurement, or any other type of MRI pulse sequence known in the art, can be used in conjunction with the disclosed invention.

Figure 12:
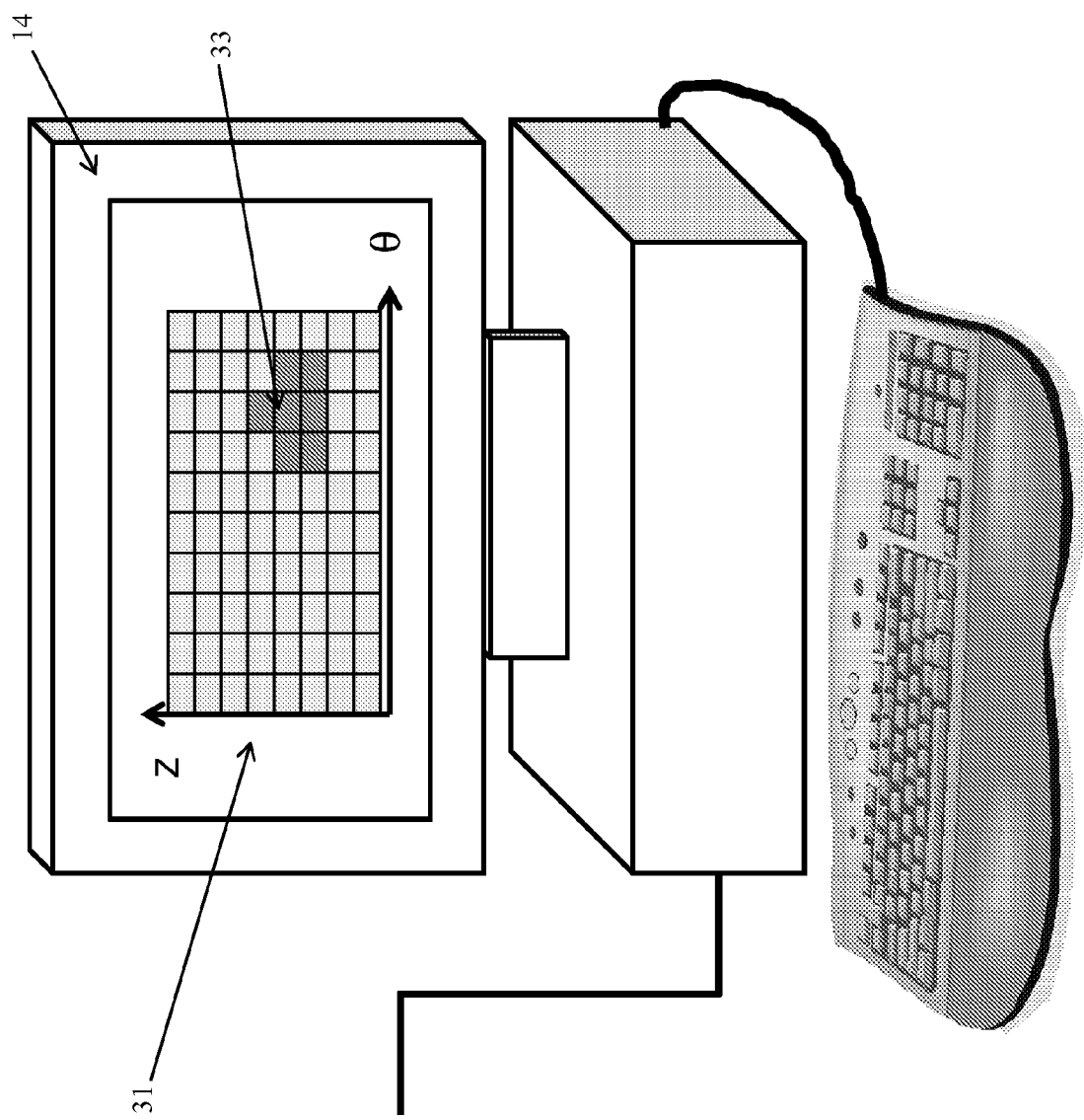
FIG. 12 is a simplified illustration of one possible way to display the margin status information on the control unit of the MRI scanner described in FIG. 5.

Reference is now made to FIG. 12, which illustrates one possible way to display the margin status information on the control unit 14 of the MRI scanner 12 of FIG. 5. The MR image 31 is a pixel matrix, which has two dimensions: z and θ. The intensity (or information in general) of each pixel 33 is related to the MR signal acquired at the margins of (up to a few millimeters into) the excised lump. At each angular position of the rotating stage, one z-vector of pixels is acquired. Upon completion of the angular rotation, the full margin status map is displayed as the MR image. Pixels that contain different intensities, for example, on diffusion-weighted imaging, may represent a suspected tumor on the margins. The fact that the sensitive region extends a specific distance of only a few millimeters into the sample means that only margins are measured. By using the ex-vivo sample holder that maintains regular lump edges, a simple rotating stage and the z-gradient, a simple and fully automated margin scan is achieved.

Figure 13:
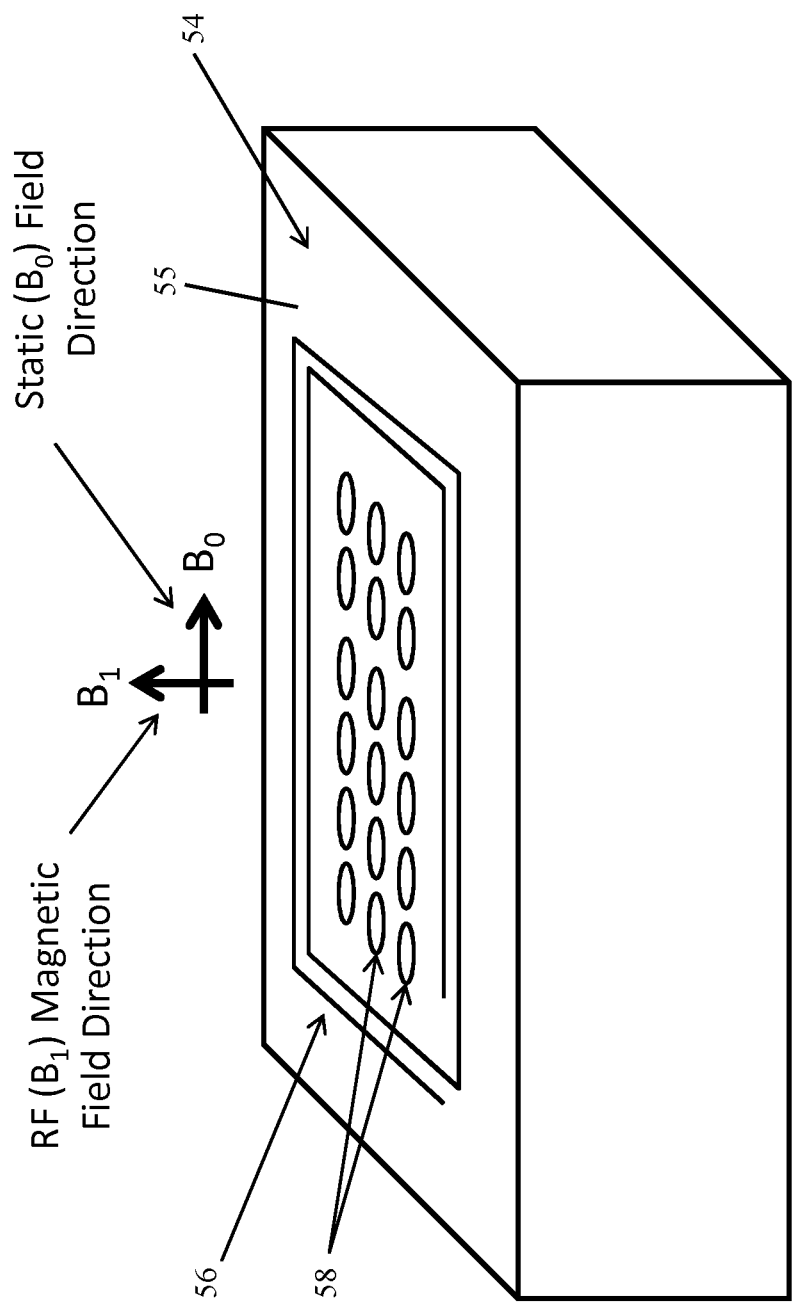
FIG. 13 is a simplified illustration of an MRI scanner that can be used for margin assessment of excised lumps, constructed and operative in accordance with another embodiment of the present invention.

Reference is now made to FIG. 13, which illustrates an MRI scanner 13 that can be used for margin assessment of excised lumps, constructed and operative in accordance with another non-limiting embodiment of the present invention.

A box-shaped (prismatic) magnet 54 creates a static magnetic field ($B_0$) tangent to, i.e., planar with or parallel to, an upper magnet surface 55. It is possible, although not shown here, that at close proximity to the magnet surface 55, a relatively homogeneous magnetic field can be created. Alternatively, many other configurations of magnetic field sources can be designed to create a magnetic field, which is relatively homogenous within a similar plane. A transmit coil 56 can be wound on the magnet surface 55, so that when activated, an RF ($B_1$) magnetic field perpendicular to the magnet surface 55 can be generated. A matrix of N×M receive coils 58 can be mounted on the magnet surface 55, each with a sensitive region directly adjacent to it. Alternatively, the same N×M coil matrix 58 can be used for both transmit and receive. Alternatively, the single coil 56 can be used for both transmit and receive. In this latter single-coil configuration, if in-plane 2D resolution is required, then gradients can be used.

Figure 14:
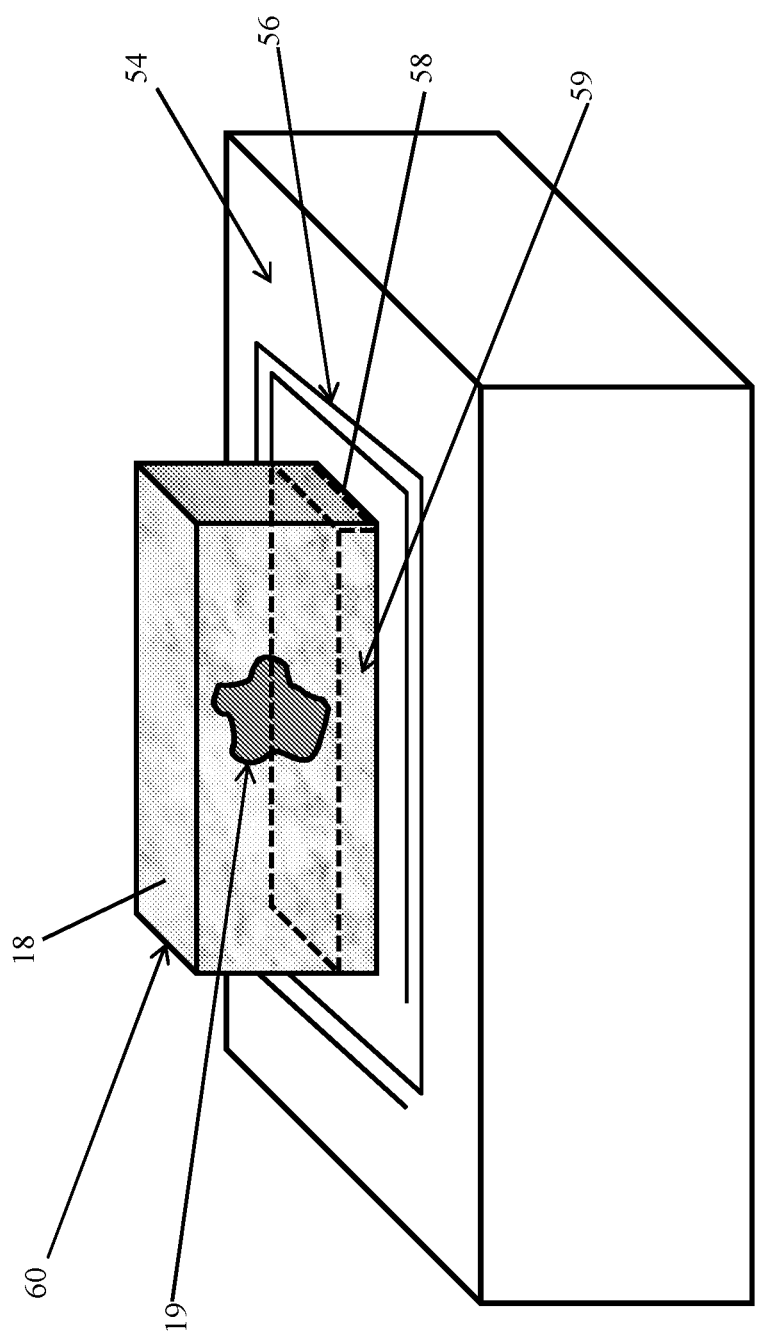
FIG. 14 is a simplified illustration of the sensitive region created within the margins of an excised lump, using the MRI scanner configuration of FIG. 13.

Reference is now made to FIG. 14, which illustrates the sensitive region 59 created within the margins of an excised lump 18, using the MRI scanner 13 of FIG. 13. The excised lump 18 is placed in a sample holder 60 that has at least one face which conforms to the shape of the magnet surface 55 of magnet 54 (that is, in this example, sample holder 60 is prismatic, and accordingly, excised lump 18 is forced into a prismatic shape). The sample holder 60 holds the excised lump 18 along with the tumor 19 over the magnet, covering over the transmit coil 56 and receive coils 58. The sensitive region, as in the other embodiments, is defined as the region within the sample in which transmit and receive coils 36 and 38 are effective in exciting and receiving MR signals from nuclear spins. Generally the depth of the sensitive region is determined by the sensitivity of the receive coils, which can be limited to just a few millimeters into the tissue—which is the preferred depth of the relevant margins. In order to complete the margin assessment of the entire lump, prismatic sample holder 60 containing the lump should be re-positioned so that all six faces are on the coils in order to measure all six faces, one face at a time. Alternatively, one may choose to scan only some of the faces. In order to maximize the detection probability (sensitivity) of the scanner if only some of the faces are scanned, the sample holder may be designed to have relatively large upper and lower faces, and very narrow side faces, so that most of the excised lump surface conforms to either upper of lower sample holder faces. In addition, one can instruct the user (physician, nurse, technician) to place the excised lump in the sample holder so that the tumor focus (if identified) is in close proximity to one of the scanned faces.

Figure 15:
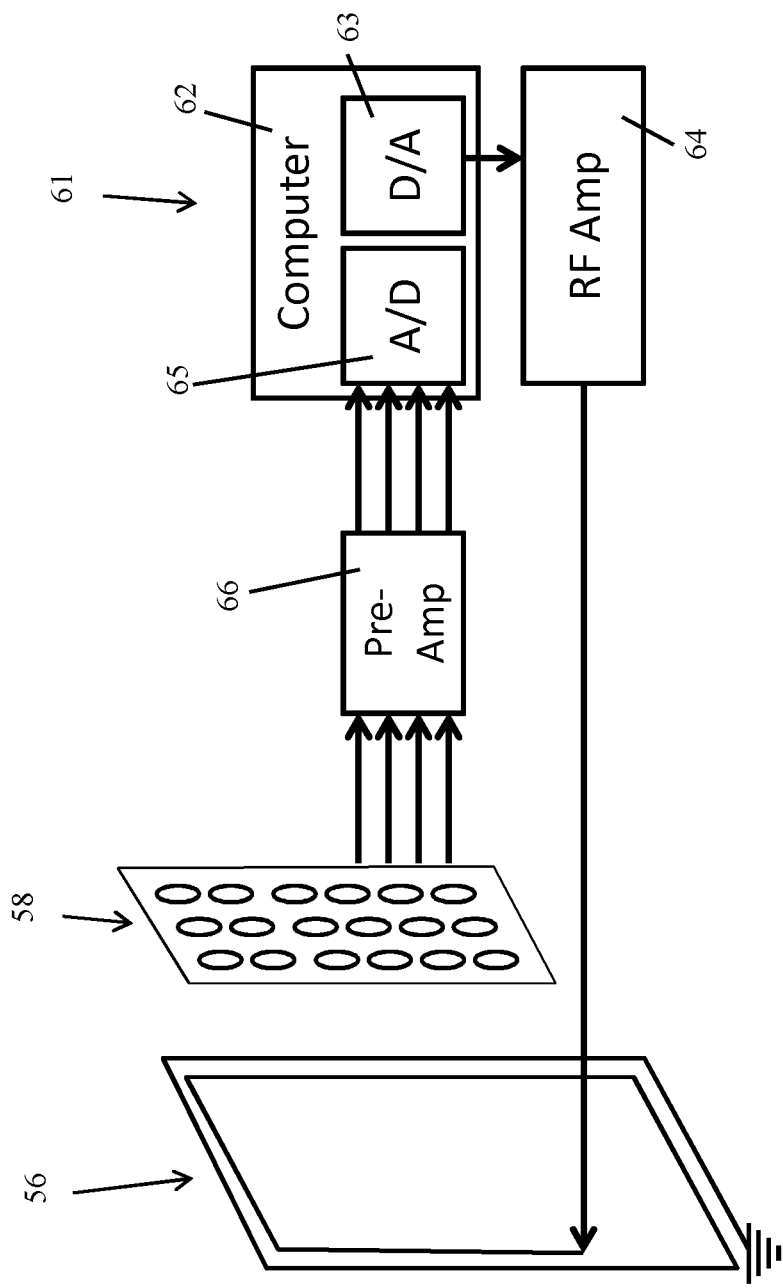
FIG. 15 is a simplified illustration of the system schematics of the MRI scanner configuration described in FIG. 13.

Reference is now made to FIG. 15, which illustrates the system schematics of the MRI scanner 13 of FIG. 13. A control unit 61 includes a PC 62, including a D/A converter 63 that generates RF pulses, amplified by an RF amplifier 64 and transmitted by transmit coil 56, and an A/D converter 65 that records the MRI signals received by the coil matrix 58 and amplified by a pre-amplifier 66. The signals received by the N×M coil matrix 58 can be either recorded simultaneously using multiple parallel data acquisition channels, or the active coils can be switched, one by one, group by group, vector by vector, etc. Methods to switch between receive channels or to record signals from multiple channels simultaneously are well known in the art.

Figure 16:
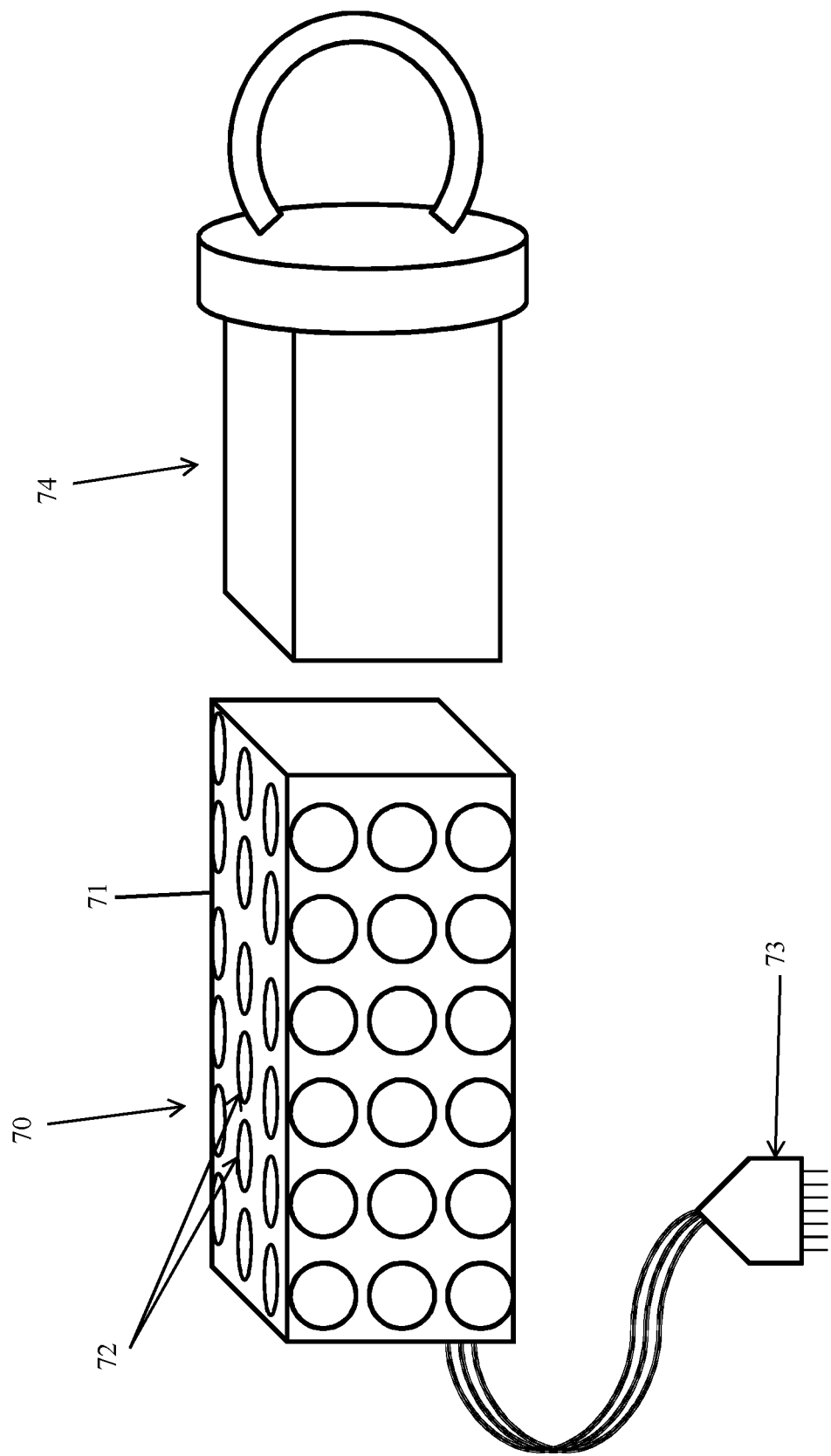
FIG. 16 is a simplified illustration of an ex-vivo sample holder, constructed and operative in accordance with another embodiment of the present invention, having integrated receive coils that can be used in conjunction with the magnet and transmit coil configuration (and instead of the receive coil configuration) described in FIG. 13.

Reference is now made to FIG. 16, which illustrates an ex-vivo sample holder 70, constructed and operative in accordance with another non-limiting embodiment of the present invention. Sample holder 70 includes a container 71 with integrated receive coils 72 that can be used in conjunction with the magnet and transmit coil configuration (and instead of the receive coil configuration) of FIG. 13. Prismatic container 71 has an integrated matrix of receive coils 72 on each of its faces. All receive coils 72 can be connected via a connector 73 to the MRI scanner during measurement. It can be readily understood that, alternatively or additionally, the transmit coil(s) can be integrated into the ex-vivo sample holder. A tightening element 74 is provided for pressing against the excised lump 18.

Figure 17:
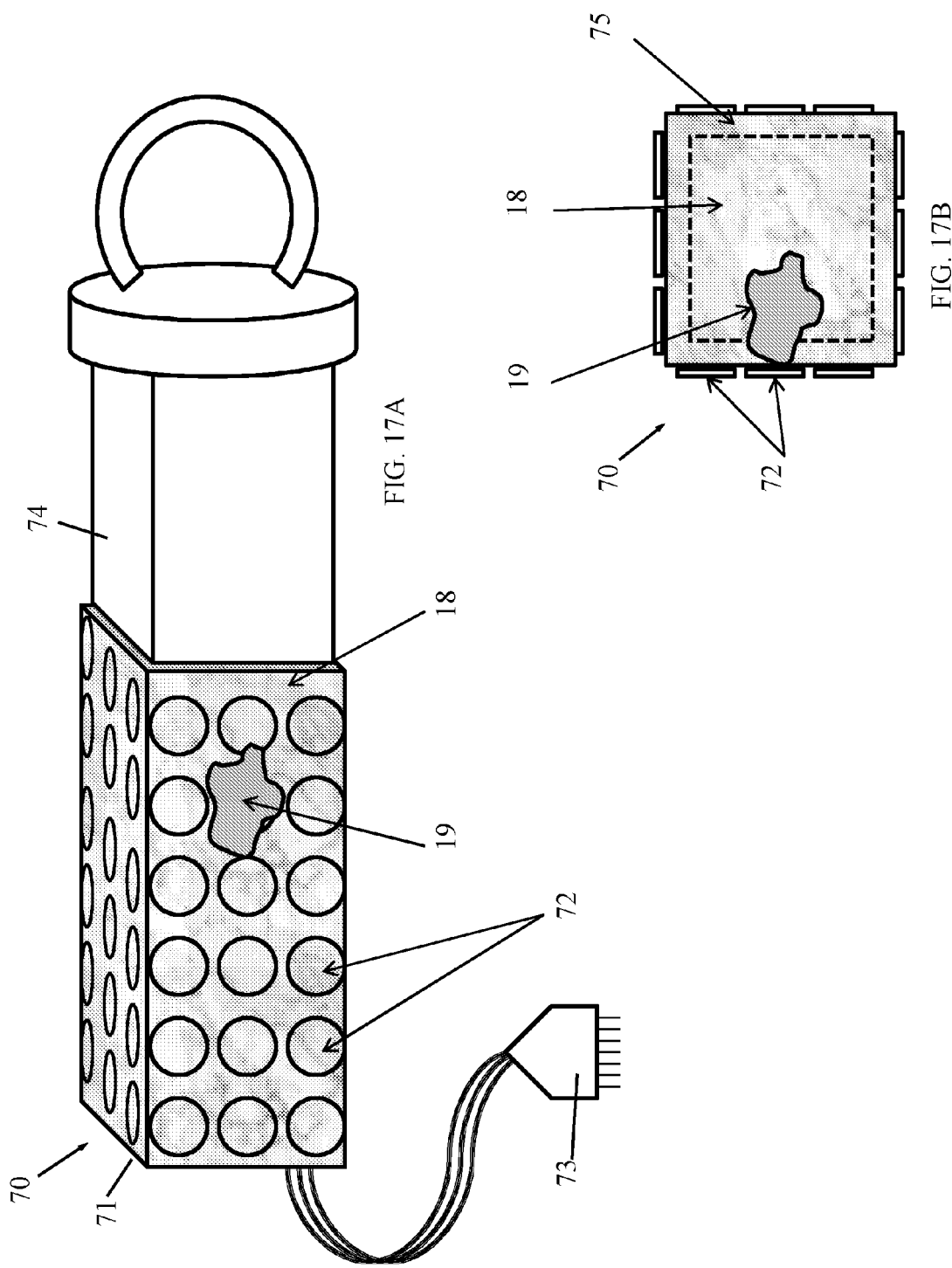

Reference is now made to FIGS. 17A and 17B, which illustrate the ex-vivo sample holder 70 of FIG. 16 with an excised lump 18 therein. FIG. 17A is a general view of the sample holder 70 and FIG. 17B is a transverse cross-section of the same sample holder 70. When the tightening element 74 is pressed against the lump 18, the lump edges conform to the sample holder shape. Each receive coil 72 has a specific sensitive region 75 extending a few millimeters into the lump, so that overall the receive coils cover the entire lump margins. If the tumor (or cancerous tissue) penetrates the sensitive region, and therefore the margins, then the specific coils that are adjacent to the penetrating tumor will detect it.

Figure 18:
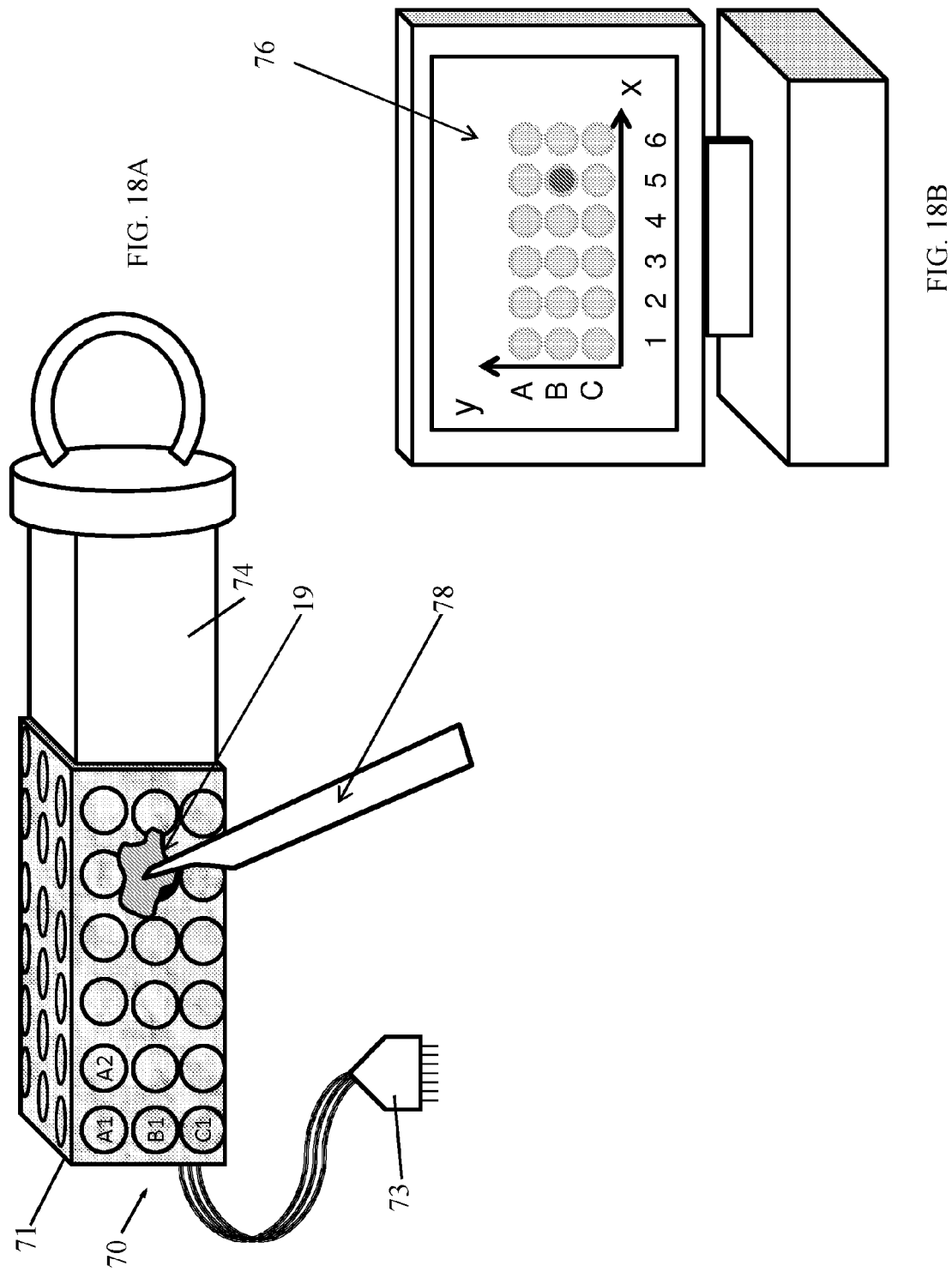
FIGS. 18A and 18B are simplified illustrations of a possible method for using the ex-vivo sample holder of FIG. 16, together with the obtained MR image, in order to mark the detected tumor on the margin for further pathological examination, in accordance with an embodiment of the present invention.

Reference is now made to FIG. 18, which illustrates a possible method for using the ex-vivo sample holder 70 of FIG. 16, together with the obtained MR image 76, in order to mark the detected tumor on the margin for further pathological examination. The MR image 76 is an N×M matrix of pixels, each corresponding to the received signal from an individual receive coil. If the tumor penetrates the margin (=sensitive region) adjacent to one or more of the receive coils, then the pixel(s) corresponding to the specific coil(s) will have a different intensity (or any other parameters, such as decay time constant). The pixel matrix and the coil matrix on the sample holder can be similarly coded, e.g. A, B, C . . . ×1, 2, 3 . . . and the operator can use an ink marker 78 to mark the region in the sample that has a suspected penetrating tumor in it. The coded positions can guide the pathologist to make a larger number of cuts in regions that are suspected with positive margins, thereby potentially increasing the overall sensitivity of the pathological analysis. Instead of using a manual ink marker, an automated marking can be designed and incorporated in the scanner itself, either by ink or by electronic means like LEDs integrated into the sample holder.

Figure 19:
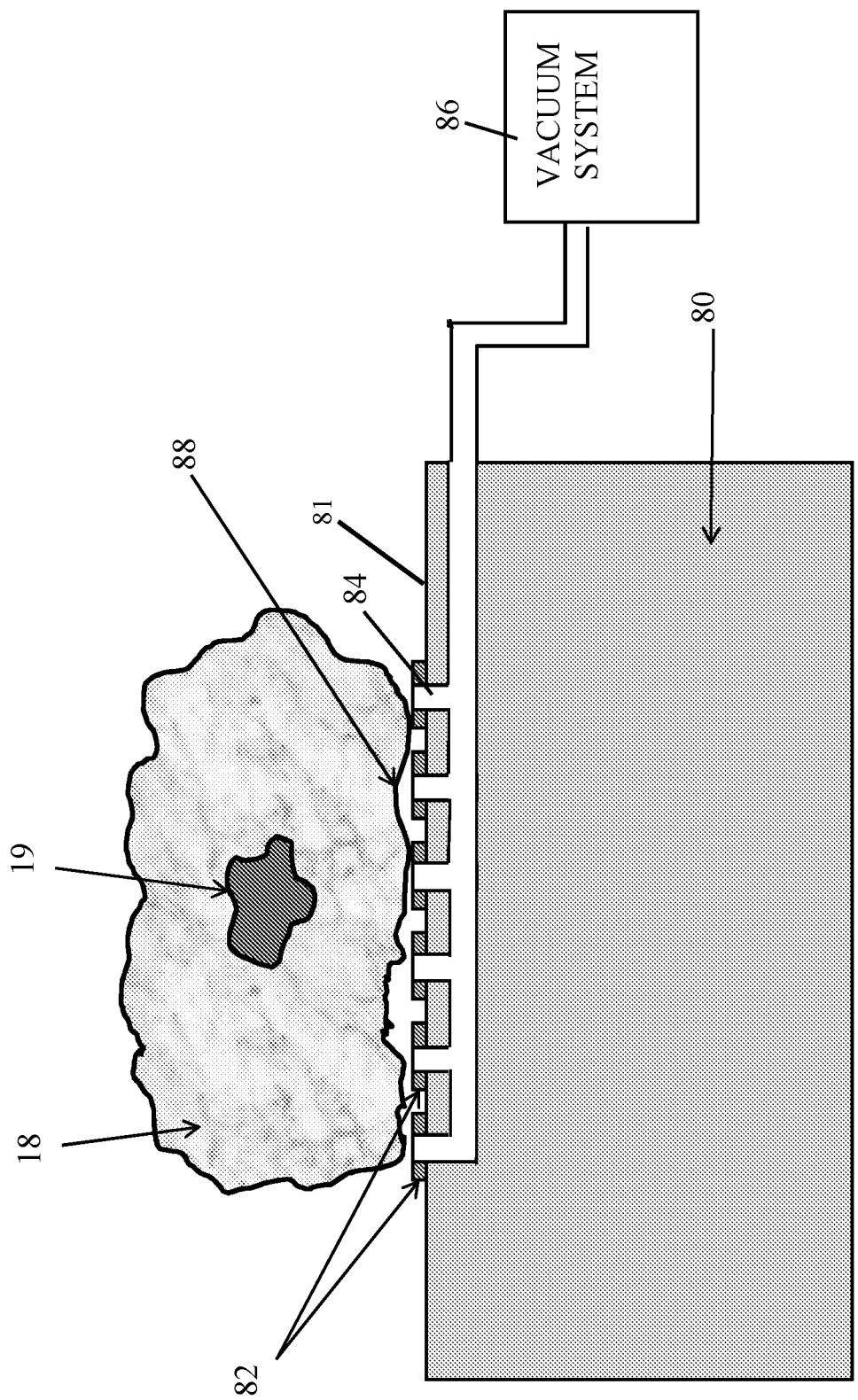
FIG. 19 is a simplified illustration of another embodiment of the MRI scanner configuration of FIG. 13, in which the sample holder is a vacuum system that holds the sample against a surface, in accordance with an embodiment of the present invention.
Figure 20:
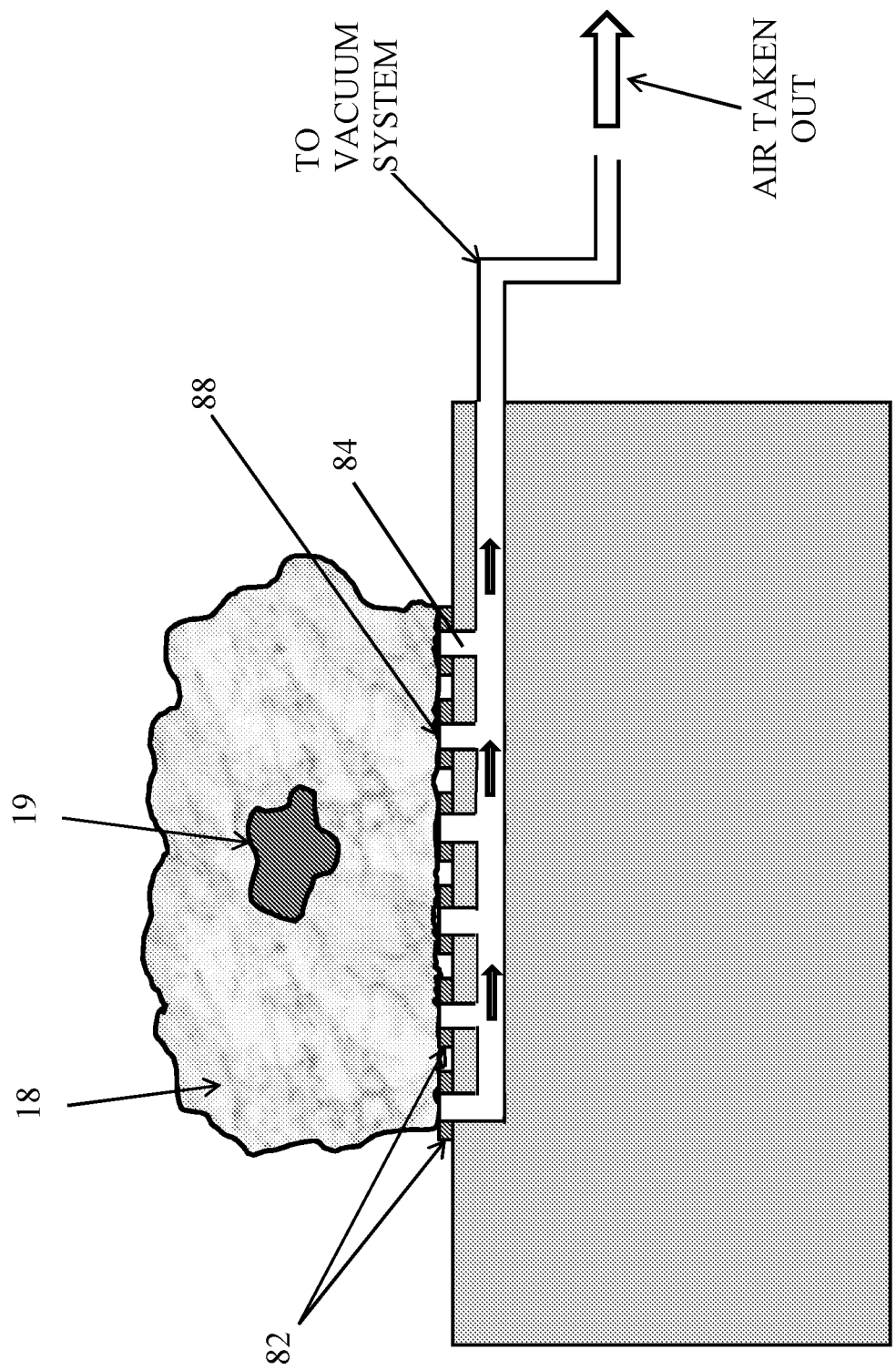
FIG. 20 is a simplified illustration of the MRI scanner configuration of FIG. 19 with air withdrawn by the vacuum system to create a regular lump surface, so that the excised lump margins can be optimally assessed by receive coils.

Reference is now made to FIG. 19, which illustrates another embodiment of the MRI scanner 13 of FIG. 13, in which the sample holder operates with vacuum. The excised lump is mounted on a surface 81 of a magnet 80 above receive coils 82. Air inlets 84 connected to a vacuum system 86 are incorporated in between the receive coils 82 so that when the excised lump 18 with its irregular surface is mounted on the surface of the magnet 80, the vacuum system 86 can gently pull the tissue on the lump surface 88 to conform it to the magnet surface (as seen in FIG. 20), so that the lump margins are within the receive coils sensitive regions.

It will be appreciated by persons skilled in the art that the present invention is not limited by what has been particularly shown and described hereinabove. Rather the scope of the present invention includes both combinations and subcombinations of the features described hereinabove as well as modifications and variations thereof which would occur to a person of skill in the art upon reading the foregoing description and which are not in the prior art.

What is claimed is:

1. A system for margin assessment of an ex-vivo tissue, comprising:
   an imaging scanner controlled by an imaging control unit; and
   an ex-vivo sample holder for holding a sample of an excised tissue, said sample holder being sized such that excised lump edges of said excised tissue are forced against a surface of said sample holder such that said edges change shape to have a predetermined geometry, and wherein said imaging scanner is positioned relative to said sample holder such that said imaging scanner acquires images only of said edges that have the predetermined geometry and which are in a sensitive region extending into a peripheral margin of said tissue, wherein said imaging scanner comprises an MRI scanner, and wherein said MRI scanner comprises a magnet formed with an internal cavity into which said sample holder is inserted.

2. The system according to claim 1, wherein said sensitive region extends up to 10 mm into said excised tissue.

3. The system according to claim 1, wherein said ex-vivo sample holder comprises a container and a tightening element that acts as a piston to force said tissue into said container so that said excised lump edges are bound by an inner periphery of said container.

4. The system according to claim 3, wherein said container is formed with airways to allow air trapped in said container to be released.

5. The system according to claim 1, wherein said sample holder is mounted on a moving stage which moves said excised tissue, and a transmit/receive coil is mounted adjacent to said cavity.

6. The system according to claim 1, wherein said MRI scanner comprises gradient coils.

7. The system according to claim 5, wherein said transmit/receive coil is sufficiently large relative to at least one dimension of said excised tissue so that an intensity of a $B_1$ magnetic field generated by said transmit/receive coil in said tissue is relatively constant throughout said dimension of said tissue.

8. The system according to claim 1, wherein said MRI scanner comprises a magnet that creates a static magnetic field ($B_0$), which, in said sensitive region, is relatively aligned in one direction relative to said magnet, and a transmit coil located with respect to said magnet, which when activated, generates a $B_1$ magnetic field perpendicular to said static magnetic field and wherein a matrix of N×M receive coils are located on said magnet surface, each with a sensitive region directly adjacent to it.

9. The system according to claim 1, wherein said sample holder is prismatic such that in order to scan the margins of the excised tissue placed within said sample holder, a different face of said sample holder is placed within said sensitive region during each measurement.

10. The system according to claim 1, further comprising a marker for marking a region in said tissue.

11. The system according to claim 1, wherein said ex-vivo sample holder comprises a vacuum system that draws said excised lump edges by vacuum against a surface.

12. The system according to claim 1, wherein said sample holder comprises a mounting surface of said magnet on which said tissue is placed.

* * * * *